(12) United States Patent
Lee

(10) Patent No.: US 6,226,764 B1
(45) Date of Patent: May 1, 2001

(54) INTEGRATED CIRCUIT MEMORY DEVICES INCLUDING INTERNAL STRESS VOLTAGE GENERATING CIRCUITS AND METHODS FOR BUILT-IN SELF TEST (BIST)

(75) Inventor: Cheol-ha Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/154,060

(22) Filed: Sep. 16, 1998

(30) Foreign Application Priority Data

Jan. 16, 1998 (KR) ..................................... 98-1199

(51) Int. Cl.[7] ................................................. G11C 29/00
(52) U.S. Cl. .......................... 714/718; 714/721; 365/201
(58) Field of Search .................................. 714/718, 721, 714/733; 365/201, 185.11, 185.23, 194, 196, 230.03, 230.06

(56) References Cited

U.S. PATENT DOCUMENTS

| | | | |
|---|---|---|---|
| 5,265,057 | * 11/1993 | Furuyama et al. | 365/201 |
| 5,298,433 | * 3/1994 | Furuyama | 365/201 X |
| 5,315,598 | * 5/1994 | Tran | 714/718 |
| 5,381,373 | * 1/1995 | Ohsawa | 365/201 |
| 5,404,099 | * 4/1995 | Sahara | 324/158.1 |
| 5,424,988 | * 6/1995 | McClure et al. | 365/201 |
| 5,638,331 | * 6/1997 | Cha et al. | 365/201 |
| 5,654,925 | * 8/1997 | Koh et al. | 365/201 |
| 5,657,282 | * 8/1997 | Lee | 365/201 |
| 5,825,785 | * 10/1998 | Barry et al. | 714/732 |
| 5,973,981 | * 10/1999 | Lee | 365/230.01 |
| 6,031,773 | * 2/2000 | Taylor | 365/201 |

FOREIGN PATENT DOCUMENTS

40313984 * 6/1991 (JP).

* cited by examiner

Primary Examiner—Emmanuel L. Moise
(74) Attorney, Agent, or Firm—Myers Bigel Sibley & Sajovec

(57) ABSTRACT

Integrated circuit memory devices include a stress voltage generator that generates a stress voltage that is higher than the internal supply voltage of the integrated circuit memory device and that applies the stress voltage to the memory cell array during the stress BIST of the memory cell array. The stress voltage generator is preferably responsive to a BIST request signal and to a stress test signal that are applied from external of the integrated circuit memory device, to apply the stress voltage to the memory cell array and to perform a BIST of the memory cell array. The stress voltage generator is responsive to the BIST request signal and absence of the stress test signal, to apply the internal supply voltage to the memory cell array and to perform a BIST of the memory cell array. Accordingly, circuits within the integrated circuit memory device can be responsive to external test signals to generate stress voltages during BIST.

18 Claims, 3 Drawing Sheets

US 6,226,764 B1

INTEGRATED CIRCUIT MEMORY DEVICES INCLUDING INTERNAL STRESS VOLTAGE GENERATING CIRCUITS AND METHODS FOR BUILT-IN SELF TEST (BIST)

FIELD OF THE INVENTION

This invention relates to integrated circuit memory devices and testing methods therefor, and more particularly to built-in self test (BIST) circuits and methods for integrated circuit memory devices.

BACKGROUND OF THE INVENTION

Integrated circuit memory devices are widely used in consumer and commercial electronics. As is well known to those having skill in the art, integrated circuit memory devices generally include a memory cell array and peripheral circuits for reading data from, writing data to, and controlling the memory cell array.

As the size of the memory cell array continues to increase, it may become increasingly difficult to test the memory cell array. In particular, in order to test the memory cell array, a large number of test patterns may be provided to the memory cell array, and the response of the memory cell array to the test patterns may be monitored. This testing may be time-consuming and may use all of the input/output pins of the integrated circuit memory device, which may thereby limit the number of memory devices that may be tested simultaneously. Accordingly, it is known to provide a memory test pattern and control circuit in the integrated circuit memory device itself, in order to provide Built-In Self Test (BIST). More specifically, a BIST unit in the integrated circuit memory device may include a memory test pattern that is used to perform the BIST.

It is also generally known to provide stress testing of the memory cell array by applying a stress voltage that is larger than the internal supply voltage of the integrated circuit memory device, to the memory, while performing the BIST on the memory cell array. However, it may be difficult to supply the stress voltage to the memory cell array while performing the BIST on the memory cell array. Moreover, application of the stress voltage may damage the integrated circuit memory device. Finally, separate burn-in testers may be needed to test the memory using a stress voltage.

SUMMARY OF THE INVENTION

It is therefore an object of the present invention to provide improved integrated circuit memory devices and Built-In Self Test (BIST) circuits and methods therefor.

It is another object of the present invention to provide improved circuits and methods for performing stress BIST for integrated circuit memory devices.

These and other objects are provided, according to the present invention, by integrated circuit memory devices that include a stress voltage generator that generates a stress voltage that is higher than the internal supply voltage of the integrated circuit memory device and that applies the stress voltage to the memory cell array during the stress BIST of the memory cell array. The stress voltage generator is preferably responsive to a BIST request signal and to a stress test signal that are applied from external of the integrated circuit memory device, to apply the stress voltage to the memory cell array and to perform a BIST of the memory cell array. The stress voltage generator is responsive to the BIST request signal and absence of the stress test signal, to apply the internal supply voltage to the memory cell array and to perform a BIST of the memory cell array. Accordingly, circuits within the integrated circuit memory device can be responsive to external test signals to generate stress voltages during BIST.

Integrated circuit memory devices according to the invention may also include a stress controller that is responsive to the stress test signal that is applied from external of the integrated circuit memory device, to control the stress voltage generator. A BIST unit is responsive to the BIST request signal that is applied from external of the integrated circuit memory device, to perform the BIST of the memory cell array.

The stress voltage generator preferably includes an internal supply voltage generator that generates the stress voltage from a reference voltage, and a clamping unit that clamps the stress voltage to the internal supply voltage in response to a control signal. A stress controller is responsive to the stress test signal that is applied from external of the integrated circuit memory device, to disable the control signal.

Accordingly, in order to stress BIST a memory cell array, a stress voltage is generated that is higher than the internal supply voltage of the integrated circuit memory device. The stress voltage is applied to the memory cell array and stress built-in self testing of the memory cell array is performed simultaneously.

According to another aspect of the invention, various externally controlled and BIST tests may be performed on an integrated circuit memory device by performing the following steps in the integrated circuit memory device in response to an external signal. A determination is made as to whether the integrated circuit memory device is in normal BIST mode or in stress BIST mode in response to the external signal. BIST is performed on the memory cell using an internal supply voltage if the memory is in normal BIST mode. Alternatively, a stress voltage that is higher than the internal supply voltage is generated and BIST is performed on the memory cell array using the stress voltage if the memory is in stress BIST mode. A determination is also made as to whether the integrated circuit memory device is in an externally controlled test mode in response to the external signal. The memory cell array is tested under external control if the integrated circuit memory device is in the externally controlled test mode.

In the external test mode, a determination may be made as to whether the integrated circuit memory device is in an externally controlled normal test mode or in an externally controlled direct access test mode. The memory cell array may be tested normally if the integrated circuit memory device is in the externally controlled normal test mode. The memory cell array may be directly accessed and tested if the integrated circuit memory device is in the externally controlled direct access test mode. Accordingly, normal BIST and stress BIST may be performed internal to the memory device under control of external mode signals.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
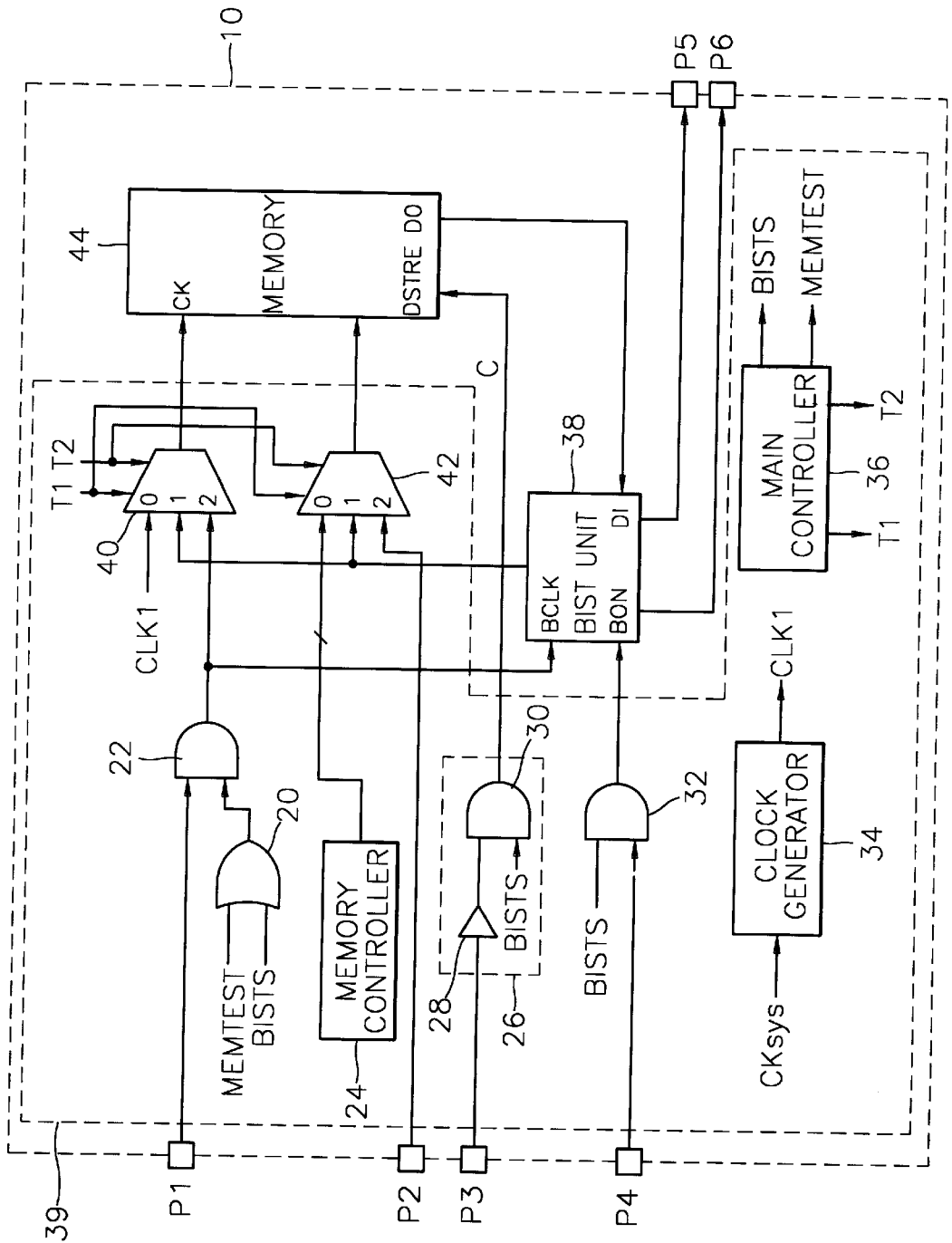
FIG. 1 is a block diagram of integrated circuit memory devices including circuits and methods for testing a memory using a stress voltage, according to a preferred embodiment of the present invention.

Referring to FIG. 1, an integrated circuit memory device 10 including circuits and methods for testing a memory using a stress voltage, according to the present invention, is shown. The integrated circuit memory device 10 includes a logic unit 39 including an OR gate 20, first and second AND gates 22 and 32, a memory controller 24, a stress controller 26 including an input buffer 28 and a third AND gate 30, a clock generator 34, a main controller 36, and first and second multiplexers 40 and 42. Integrated circuit memory device 10 also includes a built-in self test (BIST) unit 38 and a memory cell array, also referred to as a "memory" 44.

The clock generator 34 shown in FIG. 1 divides a system clock signal $Ck_{sys}$ by a predetermined number, and outputs the divided frequency as a first clock signal CLK 1. The main controller 36 generates a memory test signal MEMTEST to test the memory 44, and generates a BIST request signal BISTS to perform BIST on the memory 44. The main controller 36 determines in which way the memory 44 will be tested, and generates later-described test selection signals T1 and T2 according to the result of the determination, for example, as shown in the following Table 1.

TABLE 1

| T1 | T2 | Testing mode |
|---|---|---|
| 0 | 0 | normal BIST mode |
| 0 | 1 | stress BIST mode |
| 1 | 0 | DA mode |
| 1 | 1 | normal mode |

DA mode denotes a direct access mode, and '0' and '1' denote "low" and "high" logic levels, respectively.

The memory controller 24 outputs various control signals for controlling the memory 44. The various control signals can include a write enable signal and a read enable signal.

The OR gate 20 shown in FIG. 1 performs an OR operation on the memory test signal MEMTEST and BIST signal BISTS output from the main controller 36, and outputs the result of the OR operation to the first AND gate 22. The first AND gate 22 performs an AND operation on the output of the OR gate 20 and a test clock signal CLK2 that is input via a first pin P1, and outputs the result of the AND operation to the first multiplexer 40 and the clock terminal BCLK of the BIST unit 38. The second AND gate 32 performs an AND operation on a BIST signal BISTS and state information for BIST input via a fourth pin P4, and outputs the result of the AND operation to a BIST-ON terminal (BON) of the BIST unit 38.

The BIST unit 38 outputs various control signals, address and data for performing BIST on the memory 44, to the first and second multiplexers 40 and 42, in response to a BIST-ON signal input from the second AND gate 32 via the BON terminal and to a clock signal input via its clock terminal BCLK. Also, the BIST unit 38 receives via input terminal D1 data output from the output terminal DO of the memory 44, determines whether the memory 44 is faulty, and outputs the result of the determination to external of the memory device via a fifth pin P5. The BIST unit 38 determines whether the first and second multiplexers 40 and 42 are faulty, and outputs the result of the determination to external of the memory device via a sixth pin P6. The various control signals output from the BIST unit 38 can include a write or read enable signal. As a result, the BIST unit 38 can test whether any cell included in the memory 44 is faulty, by the aforementioned operation.

The first multiplexer 40 selects one of a first clock signal CLK1, the output of the first AND gate 22, and the various control signals, data or addresses output from the BIST unit 38, in response to the above-described test selection signals T1 and T2, and outputs the selected signal to the clock terminal CK of the memory 44. The second multiplexer 42 selects one of the signals output from the memory controller 24 and the BIST unit 38 and direct access test signals input from an external source via the second pin P2, in response to the test selection signals T1 and T2, and outputs the selected signal to the memory 44. The second pin P2 of the integrated circuit 10 is used either as a test pin for inputting the direct access test signal during testing, or as a logic pin for inputting various logic signals during normal operation.

The third AND gate 30 in the stress controller 26 shown in FIG. 1 performs an AND operation on a BIST signal BISTS and a stress test signal input from the third pin P3 via the input buffer 28, and outputs the result of the AND operation as a control signal C to the memory 44. The stress test signal includes information indicating if the level of supply voltage used by the memory 44 will be increased to a predetermined value or above, that is, if a stress will be applied to the supply voltage.

The memory 44 can be a dynamic RAM (DRAM), a static RAM (SRAM), a flash RAM, or other memory cell array. The memory 44 performs an operation corresponding to a signal input from the second multiplexer 42, in response to a clock signal input via its clock terminal CK, and outputs the result of the operation to the BIST unit 38 via its output terminal D0. A supply voltage generation unit (described below) included in the memory 44, clamps the level of its self-generated internal supply voltage in response to a control signal C that is input via its control terminal DSTRE, and outputs as a stress voltage an internal supply voltage having a non-clamped level, to the memory 44.

Figure 2:
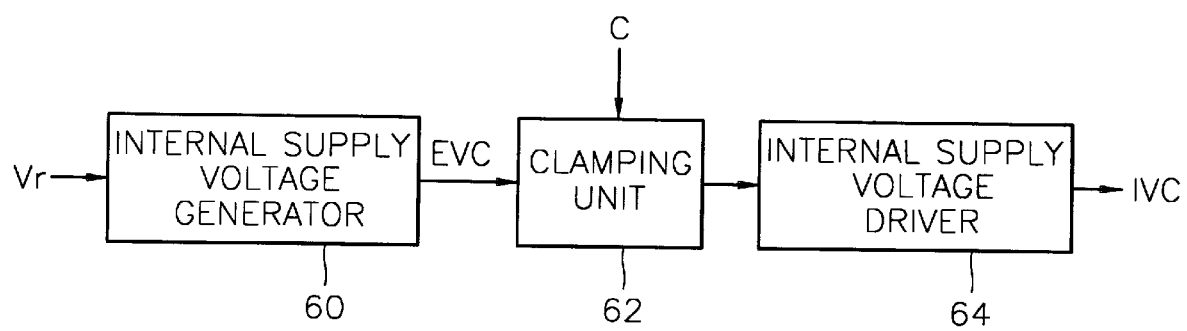
FIG. 2 is a block diagram of a preferred embodiment of a supply voltage generation unit which can be included in the memory shown in FIG. 1.

FIG. 2 is a block diagram of a preferred embodiment of a supply voltage generation unit according to the present invention which can be included in the memory 44 shown in FIG. 1. The supply voltage generation unit includes an internal supply voltage generator 60, a clamping unit 62 and an internal supply voltage driver 64.

Figure 3:
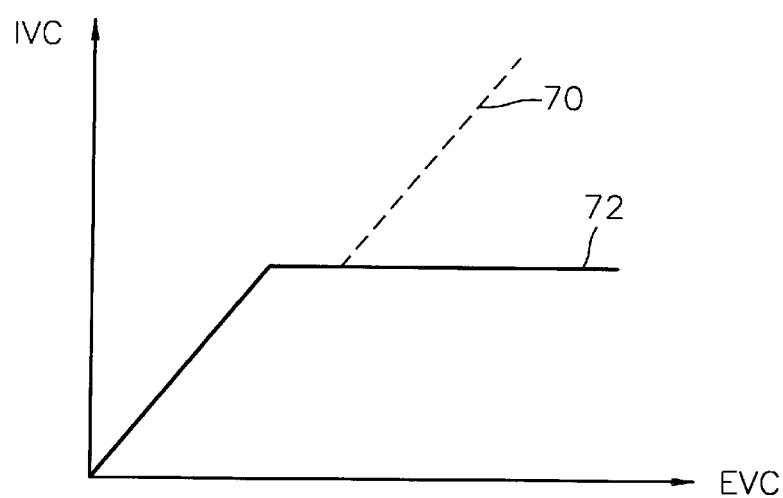
FIG. 3 is a graph illustrating operation of the supply voltage generation unit shown in FIG. 2.

FIG. 3 is a graph explaining operation of the supply voltage generation unit shown in FIG. 2. The horizontal axis indicates a supply voltage EVC, and the vertical axis indicates an internal supply voltage IVC.

The internal supply voltage generator 60 shown in FIG. 2 generates the supply voltage EVC using a reference voltage Vr input from an external source, and outputs the generated supply voltage EVC to the clamping unit 62. The clamping unit 62 clamps the level of the supply voltage EVC input from the internal supply voltage generator 60, in response to the control signal C, and outputs signals having clamped and non-clamped levels as normal supply voltage 72 and stress voltage 70, respectively, to the internal supply voltage driver 64. For example, if a control signal C of "high" logic level is input, the clamping unit 62 clamps the supply voltage EVC, but if a control signal C of "low" logic level is input, the clamping unit 62 is disabled and does not clamp the supply voltage EVC. The internal supply voltage driver 64 receives the internal supply voltage, that is, the normal supply voltage 72 or stress voltage 70, from the clamping unit 62, enhances the driving capability of the internal supply voltage, and outputs the result as the internal supply voltage IVC. The internal supply voltage driver 64 can be eliminated if not needed.

Figure 4:
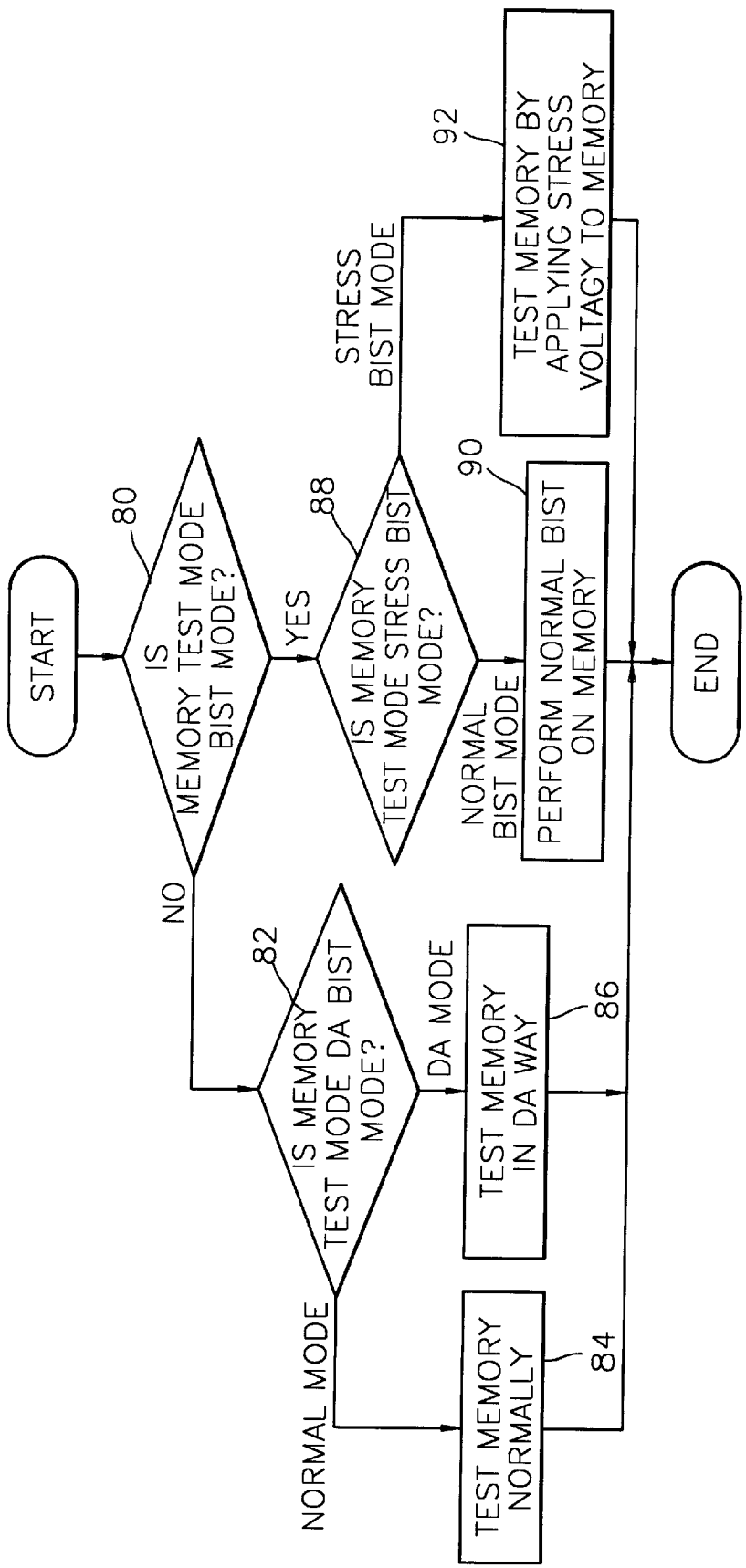
FIG. 4 is a flowchart illustrating memory testing according to the present invention which can be performed in an integrated circuit memory device such as shown in FIG. 1.

Memory testing for integrated circuit memory devices according to the present invention using a stress voltage will now be described, referring to the attached drawings. FIG. 4 is a flowchart illustrating memory testing according to the present invention which is performed in the integrated circuit 10 shown in FIG. 1. Accordingly, FIG. 4 describes memory testing methods, structures and functions.

Referring to FIG. 4, the integrated circuit 10 shown in FIG. 1 determines whether a memory test mode is a BIST mode, in block 80. If the memory test mode is not the BIST mode, the integrated circuit 10 determines whether the memory test mode is a DA mode or a normal mode, in block 82. If the memory test mode is the normal mode, the BIST unit 38 and the logic unit 39 in the integrated circuit 10 normally test the memory 44, in block 84. However, if the memory test mode is the DA mode, the BIST unit 38 and the logic unit 39 directly access and test the memory 44, in block 86. Thus, the memory 44 in a wafer state may be directly tested using memory test equipment.

On the other hand, if the memory test mode is the BIST mode, the integrated circuit 10 determines whether it is a stress or normal BIST mode, in block 88. If it is the stress BIST mode, as described above, the supply voltage generation unit generates a stress voltage 70 of a predetermined level or above as a supply voltage of the memory 44, and the BIST unit 38 checks if the memory operating according to the generated stress voltage 70 is faulty, in block 92. However, if the memory test mode is the normal BIST mode, a normal BIST is performed on the memory 44, in block 90. The aforementioned blocks 90 and 92 preferably may be performed after the integrated circuit 10 is packaged.

As described above, in memory testing according to the present invention, the normal BIST mode for testing the memory 44 built in the packaged-state integrated circuit 10 can be changed to the stress BIST mode. Thus, inferiority of the memory due to burn-in can be screened in early stage.

Assume that 3 volts of internal supply voltage is applied to the memory 44 in the normal BIST mode, and 4 volts of internal supply voltage as stress voltage are applied to the memory 44 to test the memory. Conventionally, it may be difficult to supply the 4 volts of internal supply voltage to the memory during a normal BIST mode. However, in the present invention, the level of 3 volts internal supply voltage is raised to 4 volts by the clamping unit 62 in a stress BIST mode, so that the memory 44 can be tested.

As described above, in integrated circuit memory devices and testing circuits and methods according to the present invention, a stress voltage of a predetermined level or above may be generated by a logic unit 39 rather than by conventional memory burn-in equipment. Thus, the manufacturing cost of the integrated circuit may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a memory cell array in the integrated circuit memory device; and
   a stress voltage generator in the integrated circuit memory device that generates a stress voltage that is higher than the internal supply voltage of the integrated circuit memory device and that applies the stress voltage to the memory cell array during stress built-in self test of the memory cell array;
   wherein the stress voltage generator is responsive to a built-in self test request signal and to a stress test signal that are applied from external of the integrated circuit memory device, to apply the stress voltage to the memory cell array and to perform a built-in self test of the memory cell array, and is responsive to the built-in test request signal and absence of the stress test signal, to apply the internal supply voltage to the memory cell array and to perform the built-in self test of the memory cell array.

2. An integrated circuit memory device according to claim 1 further comprising:
   a stress controller that is responsive to the stress test signal that is applied from external of the integrated circuit memory device, to control the stress voltage generator; and
   a BIST unit that is responsive to the built-in self test request signal that is applied from external of the integrated circuit memory device to perform the built-in self test of the memory cell array.

3. An integrated circuit memory device comprising:
   a memory cell array in the integrated circuit memory device; and
   a stress voltage generator in the integrated circuit memory device that generates a stress voltage that is higher than the internal supply voltage of the integrated circuit memory device and that applies the stress voltage to the memory cell array during stress built-in self test of the memory cell array;
   wherein the stress voltage generator comprises:
   an internal supply voltage generator that generates the stress voltage from a reference voltage; and
   a clamping unit that clamps the stress voltage to the internal supply voltage in response to a control signal.

4. An integrated circuit memory device according to claim 3 further comprising:
   a stress controller that is responsive to the stress test signal that is applied from external of the integrated circuit memory device, to disable the control signal.

5. An integrated circuit memory device comprising:
   a memory cell array in the integrated circuit memory device; and
   a stress voltage generator in the integrated circuit memory device that generates a stress voltage that is higher than the internal supply voltage of the integrated circuit memory device and that applies the stress voltage to the memory cell array during stress built-in self test of the memory cell array;
   wherein the stress voltage generator clamps the stress voltage to the internal supply voltage of the integrated circuit and applies the clamped stress voltage to the memory cell array during normal built-in self test of the memory cell array.

6. An integrated circuit memory device comprising:

a memory cell array in the integrated circuit memory device; and means, in the integrated circuit memory device, for generating a stress voltage that is higher than the internal supply voltage of the integrated circuit memory device and for applying the stress voltage to the memory cell array during stress built-in self test of the memory cell array;

wherein the generating means is responsive to a built-in self test request signal and to a stress test signal that are applied from external of the integrated circuit memory device, for applying the stress voltage to the memory cell array and for performing a built-in self test of the memory cell array, and is responsive to the built-in test request signal and absence of the stress test signal, for applying the internal supply voltage to the memory cell array and for performing the built-in self test of the memory cell array.

7. An integrated circuit memory device comprising:

a memory cell array in the integrated circuit memory device; and means, in the integrated circuit memory device, for generating a stress voltage that is higher than the internal supply voltage of the integrated circuit memory device and for applying the stress voltage to the memory cell array during stress built-in self test of the memory cell array;

wherein the generating means comprises:

means for generating the stress voltage from a reference voltage; and means for clamping the stress voltage to the internal supply voltage in response to a control signal.

8. An integrated circuit memory device according to claim 7 further comprising:

means for deactivating the control signal in response to the stress test signal that is applied from external of the integrated circuit memory device.

9. An integrated circuit memory device comprising:

a memory cell array in the integrated circuit memory device; and means, in the integrated circuit memory device, for generating a stress voltage that is higher than the internal supply voltage of the integrated circuit memory device and for applying the stress voltage to the memory cell array during stress built-in self test of the memory cell array;

wherein the generating means further comprises means for clamping the stress voltage to the internal supply voltage of the integrated circuit and for applying the clamped stress voltage to the memory cell array during normal built-in self test of the memory cell array.

10. A method of stress built-in self testing a memory cell array in an integrated circuit memory device, comprising the following steps which are performed in the integrated circuit memory device:

generating, in the integrated circuit memory device, a stress voltage that is higher than the internal supply voltage of the integrated circuit memory device;

applying the stress voltage to the memory cell array; and simultaneously with the applying step, performing stress built-in self testing of the memory cell array; wherein the generating step comprises the steps of:

generating the stress voltage from a reference voltage; and clamping the stress voltage to the internal supply voltage in response to a control signal.

11. A method of testing a memory cell array in an integrated circuit memory device, comprising the following steps which are performed in the integrated circuit memory device in response to an external signal:

determining whether the integrated circuit memory device is in normal Built-In Self Test (BIST) mode or in stress BIST mode in response to the external signal;

performing BIST on the memory cell array using an internal supply voltage if the memory is in normal BIST mode;

generating a stress voltage that is higher than the internal supply voltage and performing BIST on the memory cell array using the stress voltage if the memory is in stress BIST mode;

determining whether the integrated circuit memory device is in externally controlled test mode in response to the external signal; and testing the memory cell array under external control if the integrated circuit memory device is in the externally controlled test mode.

12. A method according to claim 11 wherein the generating step comprises the steps of:

generating the stress voltage from a reference voltage; and clamping the stress voltage to the internal supply voltage in response to a control signal.

13. A method according to claim 11 wherein the step of determining whether the integrated circuit memory device is in the externally controlled test mode in response to the external signal comprises the step of determining whether the integrated circuit memory device is in an externally controlled normal test mode or in an externally controlled direct access test mode in response to the external signal.

14. A method according to claim 13 wherein the step of testing the memory cell array under external control if the integrated circuit memory device is in externally controlled test mode comprises the steps of:

testing the memory cell array normally if the integrated circuit memory device is in the externally controlled normal test mode; and directly accessing and testing the memory cell array if the integrated circuit memory device is in the externally controlled direct access test mode.

15. An integrated circuit memory device, comprising:

a memory cell array;

means for determining whether the integrated circuit memory device is in normal Built-In Self Test (BIST) mode or in stress BIST mode in response to an external signal that is applied to the integrated circuit memory device;

means for performing BIST on the memory cell array using an internal supply voltage if the memory is in normal BIST mode;

means for generating a stress voltage that is higher than the internal supply voltage and for performing BIST on the memory cell array using the stress voltage if the memory is in stress BIST mode;

means for determining whether the integrated circuit memory device is in externally controlled test mode in response to the external signal; and means for testing the memory cell array under external control if the integrated circuit memory device is in the externally controlled test mode.

16. An integrated circuit memory device according to claim 15 wherein the generating means comprises:

means for generating the stress voltage from a reference voltage; and means for clamping the stress voltage to the internal supply voltage in response to a control signal.

17. An integrated circuit memory device according to claim 15 wherein the means for determining whether the integrated circuit memory device is in the externally controlled test mode in response to the external signal comprises means for determining whether the integrated circuit memory device is in an externally controlled normal test mode or in an externally controlled direct access test mode in response to the external signal.

18. An integrated circuit memory device according to claim 17 wherein the means for testing the memory cell array under external control if the integrated circuit memory device is in externally controlled test mode comprises:

means for testing the memory cell array normally if the integrated circuit memory device is in the externally controlled normal test mode; and means for directly accessing and testing the memory cell array if the integrated circuit memory device is in the externally controlled direct access test mode.

* * * * *